(12) United States Patent
Blake et al.

(10) Patent No.: US 7,816,239 B2
(45) Date of Patent: Oct. 19, 2010

(54) TECHNIQUE FOR MANUFACTURING A SOLAR CELL

(75) Inventors: Julian G. Blake, Gloucester, MA (US); Kevin M. Daniels, Lynnfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 12/581,491

(22) Filed: Oct. 19, 2009

(65) Prior Publication Data

US 2010/0124799 A1    May 20, 2010

Related U.S. Application Data

(60) Provisional application No. 61/116,342, filed on Nov. 20, 2008.

(51) Int. Cl.
*H01L 21/04* (2006.01)

(52) U.S. Cl. .................................................... 438/510

(58) Field of Classification Search ................ None
See application file for complete search history.

(56) References Cited

U.S. PATENT DOCUMENTS

| | | | |
|---|---|---|---|
| 4,751,191 A | 6/1988 | Gonsiorawski et al. | |
| 5,868,952 A * | 2/1999 | Hatakeyama et al. | 216/66 |
| 7,294,779 B2 | 11/2007 | Watabe et al. | |
| 2004/0201806 A1* | 10/2004 | Choo et al. | 349/129 |
| 2008/0002460 A1 | 1/2008 | Tuckerman et al. | |
| 2008/0099067 A1 | 5/2008 | Ito et al. | |

* cited by examiner

*Primary Examiner*—Scott B Geyer

(57) ABSTRACT

Techniques for manufacturing solar cells are disclosed. In one particular exemplary embodiment, the technique may comprise disposing a mask upstream of the solar cell, the mask comprising a plurality of filaments spaced apart from one another to define at least one aperture; directing a ribbon ion beam of desired species toward the solar cell to ion implant a portion of the solar cell defined by the at least one aperture of the mask; and orienting the ribbon ion beam such that longer cross-section dimension of the ribbon beam is perpendicular to the aperture in one plane.

15 Claims, 4 Drawing Sheets

TECHNIQUE FOR MANUFACTURING A SOLAR CELL

PRIORITY

This application claims priority under 35 U.S.C. 119(e)(1) to U.S. Provisional Patent Application Ser. No. 61/116,342, filed on Nov. 20, 2008, entitled "Virtual Mask." The entire specification of U.S. Provisional Patent Application Ser. No. 61/116,342 is incorporated herein by reference.

FIELD

The present disclosure relates to manufacturing a solar cell substrate, more particularly, to an apparatus and method for manufacturing a solar cell using a mask.

BACKGROUND

Ion implantation is a technique for introducing conductivity-altering impurities into a substrate. A desired impurity material is ionized in an ion source and extracted. The extracted ions are then manipulated into an ion beam and accelerated to a prescribed energy, and directed toward the substrate and implanted. After annealing the substrate the ions are disposed in the substrate's lattice to form a region having a desired conductivity.

Solar cells are only one example of a device that uses silicon substrates. They provide pollution-free, equal-access energy using a free natural resource, and they are becoming more important globally. Any reduced cost to the manufacture or production of high-performance solar cells or any efficiency improvement to high-performance solar cells would have a positive impact on the implementation of solar cells worldwide. This will enable the wider availability of this clean energy technology.

Solar cells may require doping to improve efficiency. This doping may either be blanket doping of the entire solar cell surface of selective doping where only specific areas of the solar cell surface are doped. In the past, solar cells have been doped using a dopant-containing glass or a paste that is heated to diffuse dopants into the solar cell. The process, however, does not provide sufficient precision to allow selective doping of the various regions of the cell. Moreover, if voids, air bubbles, or contaminants are present, non-uniform doping may occur during blanket doping.

Doping may improve cells where a surface of the solar cells includes a grid of conductors that collect photocurrent. Increasing the dopant dose under these grid lines will reduce the series resistance and increase the solar cell efficiency. Increasing the dose globally or across the entire surface through blanket doping, however, will instead increases surface recombination and lower the efficiency of the solar cell. Therefore, the ability to dope a series of narrow stripes would be beneficial to solar cell production.

Solar cells could benefit from ion implantation because ion implantation allows precise doping of the solar cell and enable selective doping. Selective doping of solar cells, however, may require a certain pattern of dopants of that only certain regions of the solar cell substrate are implanted with ions. Previously, implantation of only certain regions of a substrate has been accomplished using photoresist. Use of photoresist, however, would add an extra cost to solar cell production because extra process steps are involved. This also poses a difficulty if the regions to be implanted are extremely small. Accordingly, there is a need in the art for improved implanting of solar cell substrates and, more particularly, improved implanting of solar cell substrates using a mask.

SUMMARY

Techniques for manufacturing solar cells are disclosed. In one particular exemplary embodiment, the technique may comprise disposing a mask upstream of the solar cell, the mask comprising a plurality of filaments spaced apart from one another to define at least one aperture; directing a ribbon ion beam of desired species toward the solar cell to ion implant a portion of the solar cell defined by the at least one aperture of the mask; and orienting the ribbon ion beam such that longer cross-section dimension of the ribbon beam is perpendicular to the aperture in one plane.

In accordance to another aspect of this particular exemplary embodiment, the method may further comprise providing a gap between the mask and the solar cell, the gap having a first predetermined distance.

Yet in accordance to additional aspect of this particular exemplary embodiment, the method may further comprise ion implanting the solar cell defined by the at least one aperture of the mask without implanting another portion of the solar cell under the plurality of filaments.

In accordance to further aspect of this particular exemplary embodiment, the method further comprise providing a ground voltage to the filament of the mask.

In accordance with additional aspect of this particular exemplary embodiment, the ions may contain at least one of boron (B), aluminum (Al), gallium (Ga), indium (In), thallium (Tl), carbon (C), silicon (Si), germanium (Ge), tin (Sn), lead (Pb), nitrogen (N), phosphorous (P), arsenic (As), antimony (Sb), bismuth (Bi), and tellurium (Te).

In accordance with yet additional aspect of this particular exemplary embodiment, the mask may further comprise a first and second filament supports, and wherein each of the filaments is a wire held in tension by the first and second filament supports.

In accordance with another aspect of this particular exemplary embodiment, the wire may be a metallic wire comprising at least one of gold (Au), silver (Ag), platinum (Pt), iron (Fe), nickel (Ni), copper (Cu), aluminum (Al), zinc (Zn), silicon (Sn), tin (Sn), tungsten (W), and lead (Pb), and carbon fiber.

Yet in accordance with another aspect of this particular exemplary embodiment, the wire may comprise at least one of quartz, SiC, and SiN.

In accordance to additional particular exemplary embodiment, the technique may be realized with an ion implanter for manufacturing a solar cell, the ion implanter comprising: an ion source for generating ions; a substrate support for supporting the solar cell; at least one beam-line component for manipulating ions into a ribbon ion beam and directing the ribbon ion beam toward the solar cell; and a mask upstream of the solar cell, the mask comprising first and second filament supports, and a plurality of filaments spaced apart from one another to define at least one aperture along the filaments, wherein the filaments are held in tension by the first and second filament supports.

In accordance to another aspect of this particular exemplary embodiment, each filament may comprise a wire.

In accordance to further aspect of this particular exemplary embodiment, the filaments may comprise at least one of gold (Au), silver (Ag), platinum (Pt), iron (Fe), nickel (Ni), copper (Cu), aluminum (Al), zinc (Zn), silicon (Sn), tin (Sn), tungsten (W), lead (Pb), and carbon fiber.

In accordance with yet additional aspect of this particular exemplary embodiment, the filaments may comprise dielectric material at least one of quartz, SiC, and SiN.

In accordance to another particular exemplary embodiment, the technique may be realized with a mask for manufacturing a solar cell, the mask may comprise: first and second filament supports spaced apart from one another by a first predetermined distance; and a plurality of filaments spaced apart from one another by a second predetermined distance to define at least one aperture along the filaments, wherein the filaments are held in tension by the first and second filament supports.

In accordance to another embodiment of this particular exemplary embodiment, each filament may comprise a wire.

In accordance to further embodiment of this particular exemplary embodiment, the filaments may comprise at least one of gold (Au), silver (Ag), platinum (Pt), iron (Fe), nickel (Ni), copper (Cu), aluminum (Al), zinc (Zn), silicon (Sn), tin (Sn), tungsten (W), lead (Pb), and carbon fiber.

In accordance with additional embodiment of this particular exemplary embodiment, the filaments may comprise metallic wire.

In accordance with yet additional embodiment of this particular exemplary embodiment, the filament may comprise at least one of quartz, SiC, and SiN.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings. These figures may not necessarily be drawn to scale. In addition, these figures should not be construed as limiting the present disclosure, but are intended to be exemplary only.

DETAILED DESCRIPTION

To solve the problems associated with the conventional method for manufacturing the solar cells, several embodiments of a new technique for manufacturing solar cells are introduced. For purpose of clarity and simplicity, the present disclosure focuses on the technique achieved with a beam-line ion implanter. However, those of ordinary skill in the art will recognize that the present disclosure is not limited therein. For example, other types of substrate processing systems including plasma assisted doping (PLAD) or plasma immersion ion implantation (PIII) systems may also be used.

The present disclosure also focuses on processing a solar cell substrates for purpose of clarity and simplicity. The substrate may be a single crystalline, polycrystalline, microcrystalline, or amorphous substrate, or a micro-porous substrate. In addition, the substrate may contain a single material, or the substrate may be a compound, alloy, solid solution, or mixture containing multiple materials. While silicon based solar cell substrate is mainly discussed, the present disclosure may be equally applicable to solar cell substrates containing other materials. For example, solar cell substrates containing cadmium telluride (CdTe), copper indium gallium selenide (CIGS), or other materials may also be applicable. In addition, those of ordinary skill in the art will recognize that other types of substrate may be used. Metallic, other types of semi-conducting, or insulating substrates for manufacturing other electronic, optical, or other devices may be equally applicable to the present disclosure.

Figure 1:
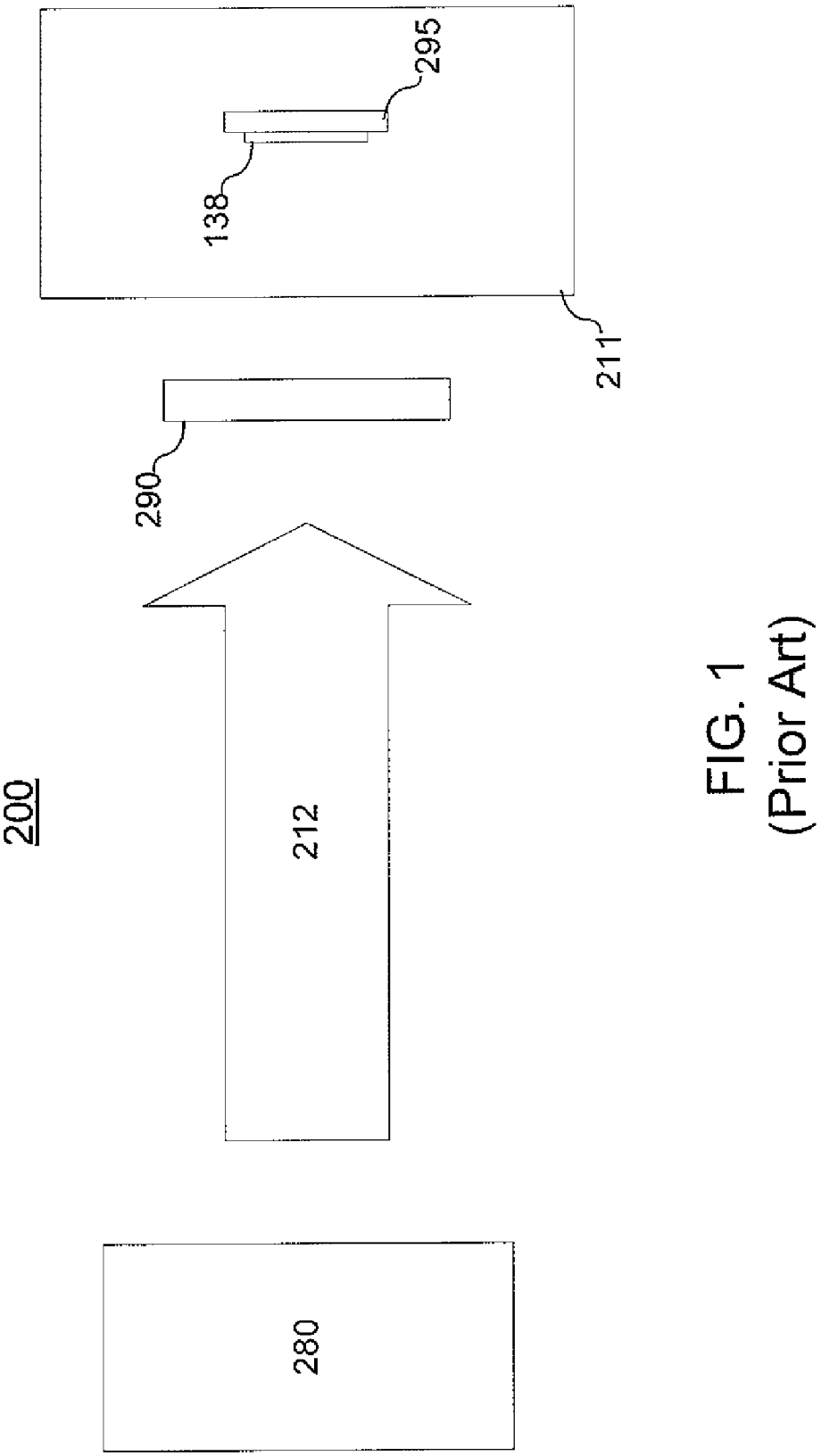
FIG. 1 illustrates a block diagram of an exemplary beam-line ion implanter.

Referring to FIG. 1, there is shown a block diagram of a beam-line ion implanter. The figure is not drawn to scale. Those skilled in the art will recognize that the beam-line ion implanters that can provide ions for doping a selected material. Thus, this process is not limited solely to the beam-line ion implanters 200 of FIG. 1. In general, the beam-line ion implanter 200 includes an ion source 280 to generate ions that are extracted to form an ion beam 212, which may be, for example, a ribbon beam or a spot beam. The ion beam 212 may be mass analyzed and converted from a diverging ion beam to a ribbon ion beam with substantially parallel ion trajectories in one instance. The beam-line ion implanter may further include an acceleration or deceleration unit 290 in some embodiments.

An end station 211 supports one or more substrates, such as substrate 138, in the path of the ion beam 212 such that ions of the desired species are implanted into substrate 138. In one instance, the substrate 138 may be a semiconductor substrate, such as, in one embodiment, a solar cell. The substrate 138 could also be, for example, a flat panel or some other substrate. The end station 211 may include a platen 295 to support the substrate 138. The end station 211 may also include in one embodiment a scanner (not shown) for moving the substrate 138 perpendicular to the long dimension of the ion beam 212 cross-section, thereby distributing ions over the entire surface of the substrate 138.

The ion implanter 200 may include additional components known to those skilled in the art as automated substrate handling equipment, Faraday sensor, or an electron flood gun. It will be understood to those skilled in the art that the entire path traversed by the ion beam is evacuated during ion implantation. The beam-line ion implanter 200 may incorporate hot or cold implantation of ions in some embodiment.

Figure 2:
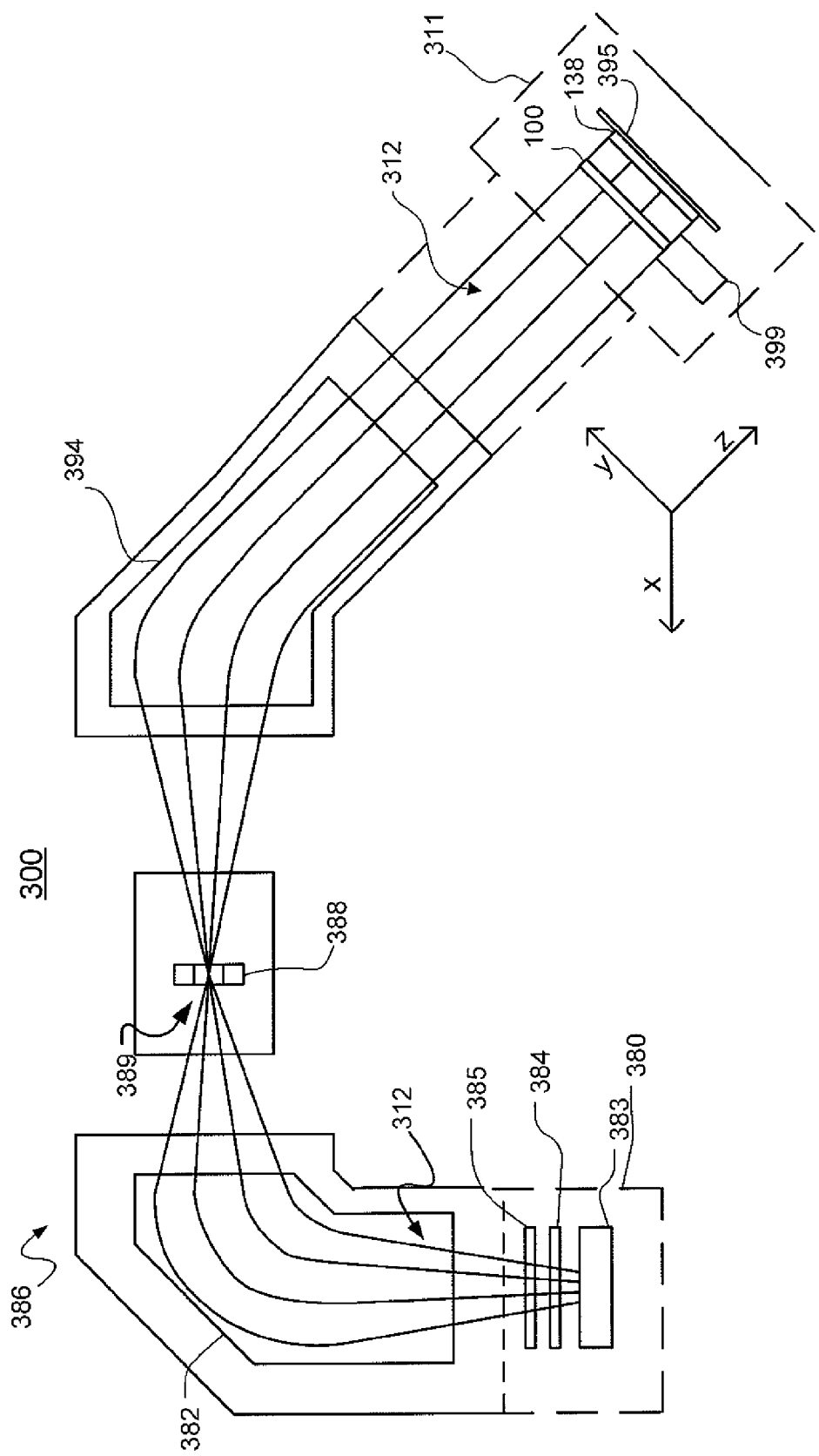
FIG. 2 illustrates a block diagram of a beam-line ion implanter for manufacturing solar cells according to one embodiment of the present disclosure.

Referring to FIG. 2, there is shown another system for manufacturing solar cells according to one embodiment of the present disclosure. The figure is not drawn to scale. The figure illustrates a beam-line ion implantation system 300. Those of ordinary skill in the art will recognize that other types of beam-line ion implanter or other types of substrate processing system may also be applicable to the present disclosure.

As illustrated in FIG. 2, the system 300 may include an ion source 380 for generating ions of desired species. The ion source 380 may include an arc chamber 383 coupled to a gas box containing feed gas of desired species. The feed gas is supplied to the arc chamber 383 and, thereafter, ionized. This gas may contain species with one or more elements from Group I and 3A-8A. For example, the feed gas may contain hydrogen (H), helium (He) or other rare gases, oxygen (O), nitrogen (N), arsenic (As), boron (B), phosphorus (P), antimony, gallium (Ga), indium (In), or other gases. In addition, the feed gas may contain carborane $C_2B_{10}H_{12}$ or another large molecular compound. The ions generated in the arc chamber 383 are then extracted by an extraction electrode including a suppression electrode 384 and a ground electrode 385. A power supply may be connected to the extraction electrode and may provide an adjustable voltage. In the present disclosure, the ions 312 extracted from the arc chamber 383 may be atomic or molecular ions containing any element from Group I and 3A-8A. In one embodiment, the ions 312 may be boron ions. In another embodiment, the ions 312 may be carborane ions, boron difluoride ions, or other large molecular ions.

The system 300 may also comprise optional beam-line components which may select ions of desired species and manipulate into an ion beam 312. The optional beam-line components may include a mass analyzer 386 and an angle corrector magnet 394. The mass analyzer 386 may include a resolving magnet 382 and a masking electrode 388. If included, the ions 312 extracted from the arc chamber 383 are directed toward the mass analyzer 386 where they may be mass analyzed. For example, the resolving magnet 382 may deflect portions of the ions 312 based on their mass such that ions 312 having desired mass may pass through the resolving magnet 382 and/or the resolving aperture 389. The ions having undesired mass, meanwhile, may be blocked by the resolving magnet 382 and/or the masking electrode 388.

The ions 312 that pass through the resolving aperture 389 may be directed toward the angle corrector magnet 394. The angle corrector magnet 394 may convert the ions 312 from a diverging ion beam to a ribbon ion beam 312, which has substantially parallel ion trajectories. For purpose of clarity and simplicity, the present disclosure may focus on a ribbon beam ion implanter. However, those of ordinary skill in the art will recognize that the present disclosure also encompasses ion implanter that uses a spot beam. In the present embodiment, the ribbon ion beam 312 traveling along z-axis may have a long dimension along x-axis, the horizontal direction, and short dimension along y-axis, the vertical direction. In another embodiment, the ribbon ion beam 312 traveling along z-axis may have a long dimension along y-axis and short dimension along the y-axis. Yet in other embodiments, the ribbon beam 312 may have other dimensions. The ion beam 212 passing through the angle corrector magnet 294 is then directed toward an end station 211 of the system 300. In some embodiments, the ion beam 312 may be accelerated or decelerated after passing through the angle corrector magnet 394 by optional acceleration or deceleration units of the system 300.

In the end station 311, one or more substrates 138 may be positioned in the ion beam path such that the ions 312 may be introduced or, in some cases, implanted into the substrate 138. To control the implantation process, the end station 311 may contain various components. For example, the end station 311 may contain a platen 395 which may support the substrate 138. The platen 395 may also control, for example, the temperature of the substrate 138 to incorporate hot or cold ion implantation. To incorporate cold ion implantation, the substrate 138 may be maintained at a temperature less than the room temperature, preferably less than 273° K. To incorporate hot ion implantation, the substrate 138 may be maintained at a temperature above the room temperature, preferably greater than 293° K. In addition to the platen 395, the system 200 of the present disclosure may contain a pre-chilling and/or pre-heating station (not shown) where the substrate 138 may be pre-chilled or pre-heated prior to ion implantation.

The end station 311 may also contain a substrate scanner (not shown), for example, a roplat, which may position the substrate 138 in the path of the ion beam 312. In addition to positioning the substrate 138, the substrate scanner may translate/rotate the substrate 138 to a desired orientation with respect to the ion beam. In one embodiment, the substrate 138 may be oriented at substantially perpendicular to the ion beam 312. In such an orientation, the ions 312 may be introduced to the substrate 138 at substantially 0° incident angle (i.e. substantially 0° from an imaginary axis that is perpendicular to the substrate 138). In another embodiment, the substrate 138 may be oriented at an angle such that ions 312 are not introduced at substantially 0° incident angle. In some embodiment, the ions 312 may be introduced at a fixed implant angle. In other embodiments, the ions 312 may be introduced at varying angle. For example, the substrate 138 may be positioned at a first angle. During implantation, the substrate 138 may be rotated (or tilt) to an angle other than the first angle. In the present disclosure, the substrate 138 may also be translated, at a desired rate, so as to control the dose of the implanted ions.

The end station 311 may also include an automated substrate handling equipment for introducing/removing the substrate 138 to/from the end station 211. The end station 311 also may include a dose measuring system and an electron flood gun. It will be understood to those skilled in the art that the ion beam path may be evacuated.

In some embodiments, the end station 311 may also comprise a mask 100 proximate to the substrate 138. The mask 100 may comprise at least one aperture to introduce ions to selected one or more regions of the substrate 138. The mask 100 may be supported by the platen 395 and/or the substrate scanner. In another embodiment, the mask 100 may be supported by a mask holder 399 disposed on the platen 395 and/or the substrate scanner. Yet in another embodiment, the mask 100 may be supported by a mask holder 399 that is separate and independent from the platen 395 and/or the substrate scanner. The separate and independent mask holder 399 may be able to orient the mask 100 at different orientations relative to the ion beam 312 and/or the substrate 138. An actuator (not shown) may be coupled to the mask holder 399 to rotate or tilt the mask 100. In another embodiment, the mask 100 may be supported by the substrate 138.

Figure 3:
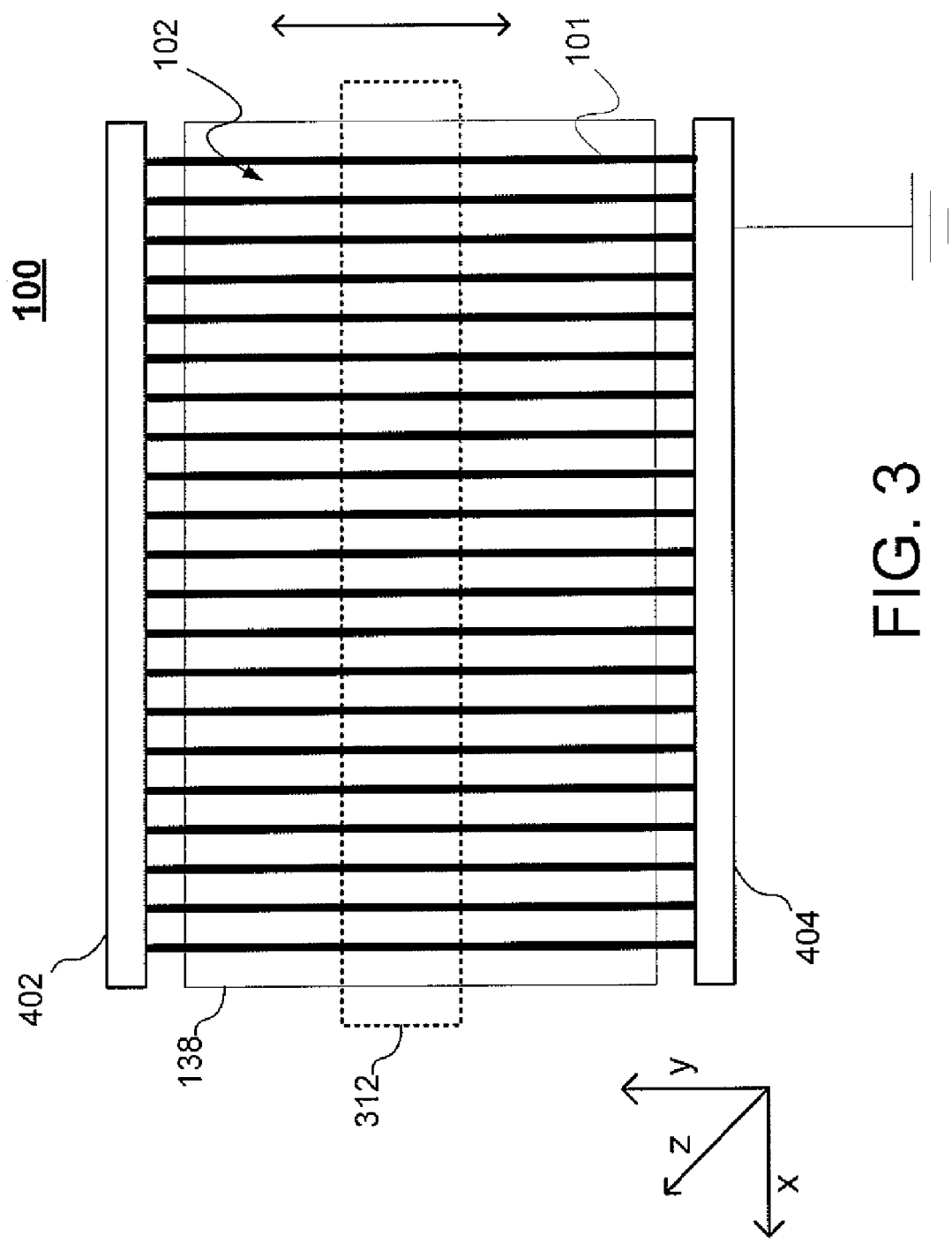
FIG. 3 illustrates a mask for manufacturing solar cells according to one embodiment of the present disclosure.

Referring to FIG. 3, there is shown a detailed view of the mask 100 for manufacturing solar cells according to one embodiment of the present disclosure. The figure is not drawn to scale. The mask 100 comprises a plurality of filament 101 defining one or more apertures 102. As illustrated in the figure, the filaments 101 are supported by first and second filament supports 402 and 404. Although not shown, the mask 100 may also include at least one side support which maintains the distance between the first and second filament supports 402 and 404 in one embodiment. In another embodiment, the distance between the first and second filament supports 402 and 404 may be maintained by some other components such as, for example, mask holder 399 or the wall of the end station 311.

The filaments 101 may be made out of various materials. In one embodiment, the filaments 101 may have a high compliance value. Example of such filaments may include a thin wire or string containing, for example, gold (Au), silver (Ag), platinum (Pt), iron (Fe), nickel (Ni), copper (Cu), aluminum (Al), zinc (Zn), silicon (Sn), tin (Sn), tungsten (W), lead (Pb), graphite and/or alloys or combination thereof. In another embodiment, the filament 101 may have a high stiffness and/or hardness value. Examples of such filaments may include ceramic or dielectric materials such as, for example, quartz, SiC, and SiN. Yet in another embodiment, material capable of withstanding harsh conditions (e.g. high temperature) associated with ion implantation may be preferred. If wire or string filaments are used, the filaments 102 may be held at sufficiently high tension. In the process, the filaments may maintain their shape, form, and orientation, distance, despite a thermal stress induced by the ion implantation.

Meanwhile, the filament supports 402 and 404 may be made from electrically conductive material in one embodiment. In another embodiment, each of the supports 402 and 404 are made from electrically insulating material. If the filaments 101 and the filament supports 402 and 404 are made from electrically conductive material, at least one of the supports 402 and 404 and/or at least one of the filaments 101 may be grounded. The filaments 101 and the filament supports 402 and 404 are made from electrically insulating material, the filament 101 and the filament supports 402 and 404 may be remain electrically floating.

The mask 100 comprising the filaments 101 and the filament supports 402 and 404 may be disposed upstream of the substrate 138, as illustrated in FIG. 2. In the present embodiment, the mask 100 may be separated from the substrate 138 by approximately 100 mm or less. In another embodiment, the mask 100 may be farther upstream from the substrate 138. Alternatively, the mask 100, in other embodiment, may even contact the substrate 138. Positioning the mask 100 apart from the substrate 138 may allow the mask 100 to move (e.g. rotate, translate, tilt etc. . . . ) independently from the substrate 138 and the ion beam 312. Accordingly, separating the mask 100 from the substrate 138 may be preferred in some embodiments.

Returning to FIG. 3, the mask 100, in the present embodiment, may preferably be oriented such that the apertures 102 and the ribbon beam 312 are non-parallel relative to one another, when disposed on the same plane. For example, the aperture 102 may extend along the vertical direction, the y-axis. Meanwhile, the ribbon beam may extend along the horizontal direction, the x-axis, such that long dimension of the ribbon beam extends in the horizontal direction and short dimension of the ribbon beam does not. Although, orienting the aperture 102 and the ribbon beam 312 in perpendicular manner is preferred, the present disclosure does not preclude orienting the aperture 102 and the ribbon 312 at other angles including 0° where they are parallel to one another.

Orienting the aperture 102 and the ribbon beam 312 in perpendicular manner may provide several advantages. In some ribbon beam ion implantation systems, the tuning process to achieve uniform beam angle may be difficult. If the beam is tuned to achieve uniform beam angle in one direction, it may become out-of-tune in the other direction. As such, ion beam tuned along the horizontal direction may have ions with uniform angle or angle purity along the horizontal direction. Along the vertical direction, however, the ions may have non-uniform angle. If the beam 312 has the angle purity along the horizontal direction, and if the beam 312 and the aperture 102 are oriented in orthogonally in the same plane, the ions from the ion beam 312 may be implanted in a region defined by the aperture 102 of the mask 100. Ions may not be implanted under the filament 101, beyond the region defined by the aperture, even if the mask 100 is spaced apart from the substrate 138. However, if the beam 312 and the aperture 102 are oriented in parallel manner, the ions may be implanted beyond the region defined by the aperture 102 unless the mask 100 is in contact with the substrate 138. Accordingly, orienting the aperture 102 and the ion beam orthogonally enables positioning of the mask 100 upstream of the substrate 138, thus allowing the mask to be a non-contacting "virtual mask". At the same time, this orientation enables the mask 100 and the substrate 138 to move independently.

In addition, the mask 100, if electrically conductive and grounded, may also provide charge neutralization of the beam to render a charge neutralizing components such as, a plasma flood gun, unnecessary.

Figure 4:
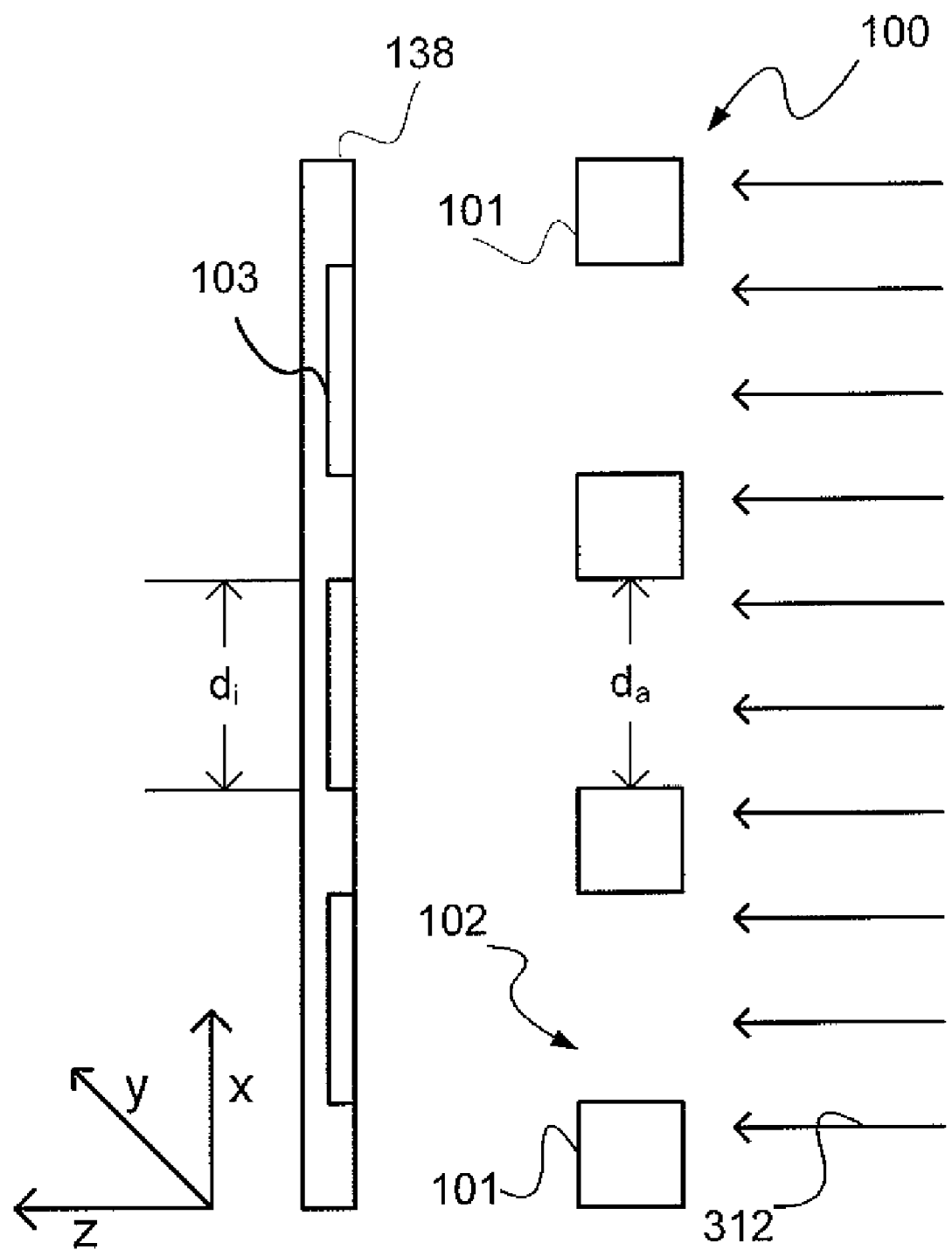
FIG. 4 illustrates the technique for manufacturing solar cells according to one embodiment of the present disclosure.

Referring to FIG. 4, there is shown a technique for manufacturing solar cells according to one embodiment of the present disclosure. In the present embodiment, the mask 100 may be positioned upstream of the substrate 138. In the present embodiment, the mask 397 may be similar to those shown in FIG. 3. Upstream of the substrate 138 and the mask 100, in the ion source 380, the ions 312 may be generated. The generated ions 312 may be directed toward the substrate 138 in a form of a ribbon ion beam 212. Although the ribbon beam is preferred, a spot ion beam is not precluded in the present disclosure. As illustrated in the figure, a portion of the ions 212 may pass through the aperture 102 and implanted into the substrate 138 to form an implanted region 103.

If a horizontally tuned ribbon beam 312 oriented substantially perpendicular to the aperture 102 is used, as shown in FIG. 3, the ions 312 may approach the substrate at 0° along the horizontal direction, x-axis. The ions may form the implanted region 103, and the region 103 may have a dimension $d_i$ along the horizontal direction that is substantially equal to the dimension of the aperture $d_a$ along the horizontal direction. Substantially uniform and clearly defined implanted regions 103 may be formed along the horizontal direction even if the mask 100 is spaced apart from the substrate 138. As such, the mask 100 may enable use of an ion implantation system 100 even if the system 200 is not tuned along one direction (e.g. vertical direction). In addition, the mask 100 need not be in contact with the substrate 138 enabling independent the substrate 138 and the mask movement 100. Such advantages may increase of the efficiency of the technique for manufacturing solar cells.

In the present disclosure, a novel technique for manufacturing a substrate, for example a solar cell, is disclosed. The terms and expressions which have been employed herein are used as terms of description and not of limitation, and there is no intention in the use of such terms and expressions of excluding any equivalents of the features shown and described (or portions thereof). It is also recognized that various modifications are possible within the scope of the claims. Other modifications, variations, and alternatives are also possible. Accordingly, the foregoing description is by way of example only and is not intended as limiting.

What is claimed is:

1. A method of manufacturing solar cell, the method comprising:
   disposing a mask upstream of the solar cell, the mask comprising a plurality of filaments spaced apart from one another to define at least one aperture;
   directing a ribbon ion beam of desired species toward the solar cell to ion implant a portion of the solar cell defined by the at least one aperture of the mask; and
   orienting the ribbon ion beam such that longer cross-section dimension of the ribbon beam is perpendicular to the aperture in one plane.

2. The method of claim 1, further comprising:
   providing a gap between the mask and the solar cell, the gap having a first predetermined distance.

3. The method according to claim 2, the method further comprising:
   ion implanting the solar cell defined by the at least one aperture of the mask without implanting another portion of the solar cell under the plurality of filaments.

4. The method according to claim 1, further comprising:
providing a ground voltage to the filament of the mask.

5. The method according to claim 1, wherein the ions contains at least one of boron (B), aluminum (Al), gallium (Ga), indium (In), thallium (Ti), carbon (C), silicon (Si), germanium (Ge), tin (Sn), lead (Pb), nitrogen (N), phosphorous (P), arsenic (As), antimony (Sb), bismuth (Bi), and tellurium (Te).

6. The method according to claim 1, wherein the mask further comprises a first and second filament supports, and wherein each of the filaments is a wire held in tension by the first and second filament supports.

7. The method according to claim 6, wherein the wire is a metallic wire comprising at least one of gold (Au), silver (Ag), platinum (Pt), iron (Fe), nickel (Ni), copper (Cu), aluminum (Al), zinc (Zn), silicon (Sn), tin (Sn), tungsten (W), and lead (Pb).

8. The method according to claim 6, wherein the wire comprises at least one of graphite, quartz, SiC, and SiN.

9. The method according to claim 6, wherein the wire comprises carbon fiber.

10. An ion implanter for manufacturing a solar cell, the ion implanter comprising:
an ion source for generating ions;
a substrate support for supporting the solar cell;
at least one beam-line component for manipulating ions into a ribbon ion beam and directing the ribbon ion beam toward the solar cell; and
a mask upstream of the solar cell, the mask comprising first and second filament supports, and a plurality of filaments spaced apart from one another to define at least one aperture along the filaments, wherein the filaments are held in tension by the first and second filament supports.

11. The ion implanter according to claim 10, wherein each filament comprises a wire.

12. The ion implanter according to claim 10, wherein the filaments comprise at least one of gold (Au), silver (Ag), platinum (Pt), iron (Fe), nickel (Ni), copper (Cu), aluminum (Al), zinc (Zn), silicon (Sn), tin (Sn), tungsten (W), lead (Pb), and carbon fiber.

13. The ion implanter according to claim 10, wherein the filaments comprise dielectric material at least one of quartz, SiC, and SiN.

14. A mask for manufacturing a solar cell, the mask comprising:
first and second filament supports spaced apart from one another by a first predetermined distance; and
a plurality of filaments spaced apart from one another by a second predetermined distance to define at least one aperture along the filaments, wherein the filaments are held in tension by the first and second filament supports, wherein the filaments comprise at least one of quartz, SiC, and SiN.

15. The mask according to claim 14, wherein each filament comprises a wire.

* * * * *